United States Patent
Lu et al.

(10) Patent No.: US 6,519,688 B1
(45) Date of Patent: Feb. 11, 2003

(54) READ DATA VALID LOOP-BACK FOR HIGH SPEED SYNCHRONIZED DRAM CONTROLLER

(75) Inventors: Wei G. Lu, San Jose, CA (US); Biranchi N. Nayak, San Jose, CA (US)

(73) Assignee: S3 Incorporated, Santa Clara, CA (US)

( * ) Notice: Subject to any disclaimer, the term of this patent is extended or adjusted under 35 U.S.C. 154(b) by 270 days.

(21) Appl. No.: 09/676,460

(22) Filed: Sep. 29, 2000

(51) Int. Cl.[7] .............................................. G06F 12/00
(52) U.S. Cl. ...................................................... 711/167
(58) Field of Search ................... 711/104, 105, 711/167

(56) References Cited

U.S. PATENT DOCUMENTS

| | | | | |
|---|---|---|---|---|
| 6,078,514 A | * | 6/2000 | Takemae et al. | ............... 365/63 |
| 6,256,235 B1 | * | 7/2001 | Lee | ........................ 365/189.11 |
| 6,449,727 B1 | * | 9/2002 | Toda | ........................... 713/401 |
| 2001/0024135 A1 | * | 9/2001 | Harrison | ..................... 327/276 |
| 2001/0047450 A1 | * | 11/2001 | Gillingham et al. | ......... 711/105 |
| 2002/0018396 A1 | * | 2/2002 | Morita et al. | ................ 365/233 |

* cited by examiner

*Primary Examiner*—Kevin Verbrugge
(74) *Attorney, Agent, or Firm*—Fenwick & West LLP

(57) ABSTRACT

In a synchronized memory system comprising a memory controller externally coupled to a synchronous memory, a read valid loop back signal is introduced for the memory controller to track the delays of signals exchanged between the memory controller and the synchronous memory, so that the uncertainty introduced by I/O pads and PCB traces used to facilitate the coupling of the memory controller with the sychronous memory is no longer the limiting factor for the speed of the memory controller. An asynchronous FIFO buffer is used to latch read data returned by the synchronous memory based on the read valid loop back signal.

13 Claims, 3 Drawing Sheets

READ_VALID feed back Schematic

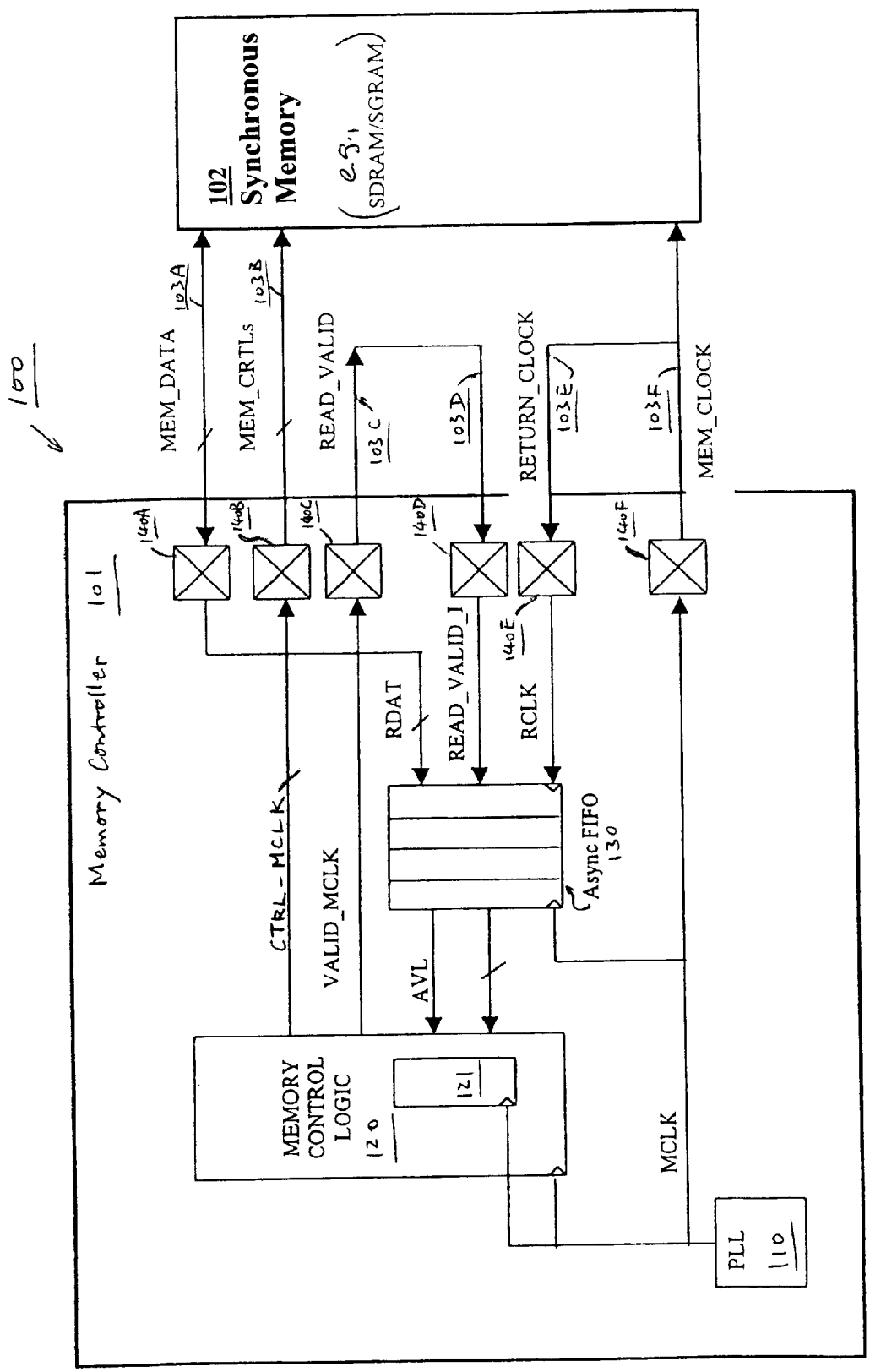
Figure 1. READ_VALID feed back Schematic

Figure 2. Timing diagram with READ_VALID feed back.

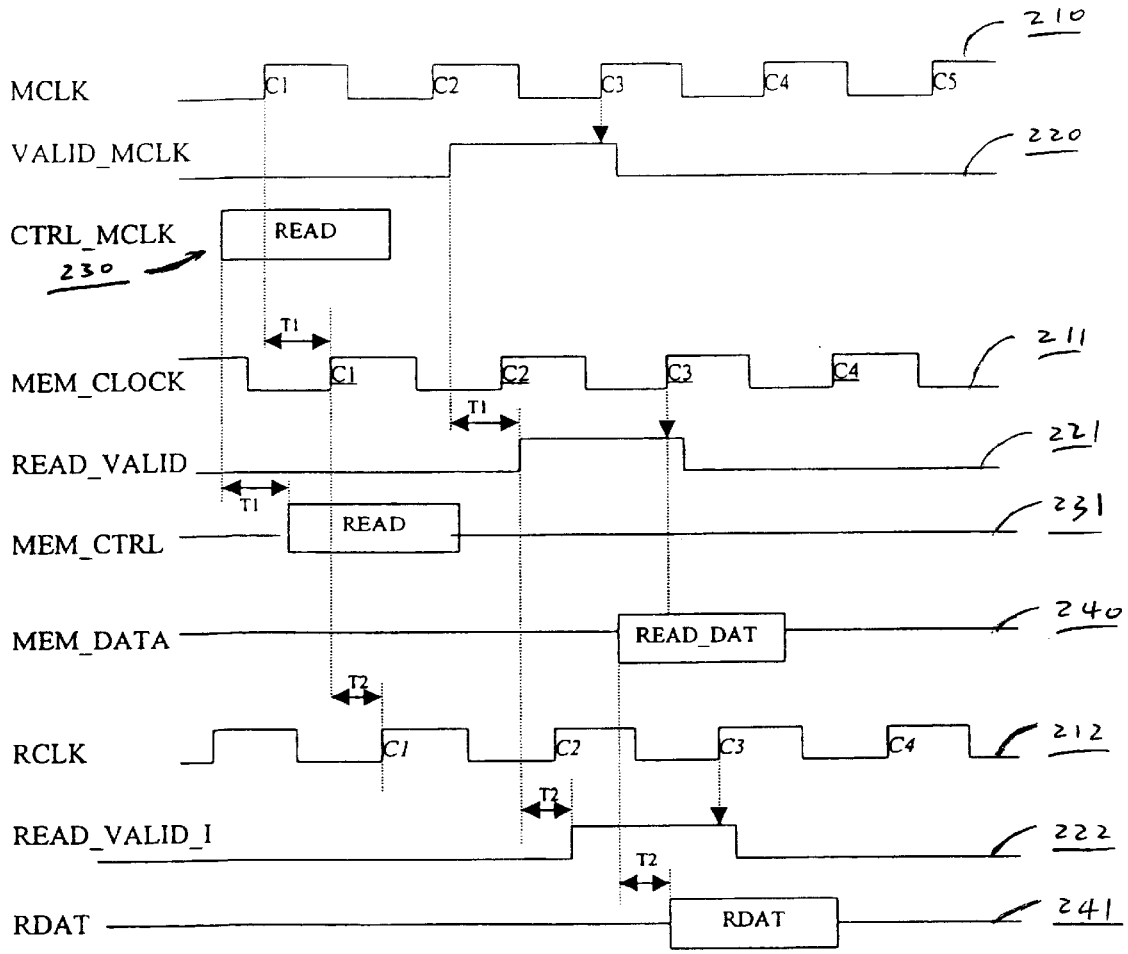

T1: IO pad output delay
T2: IO pad input delay.

1.) A read command is issued at C1 of MCLK. A Valid signal is scheduled to send out at C3 of MCLK.
2.) After T1 delay, MCLK → MEM_CLOCK, VALID_MCLK → READ_VALID, CTRL_MCLK → MEM_CTRL.
3.) SDRAM/SGRAM put read data on C3 rising edge of MEM_CLOCK.
4.) After T2 delay, MEM_CLOCK → RCLK, MEM_DATA → RDAT, READ_VALID → READ_VALID_I.
5.) At C3 rising edge of RCLK, RDAT is written into Async fifo, READ_VALID_I is used as fifo Write enable.
6.) Finally, read data is read out from Async fifo at MCLK domain.

By using above scheme, the internal memory controller clock is totally decoupled with Return clock. IO pad delay, and PCB trace delay will not be a critical timing path any more For high speed synchronize DRAM controller.

READ DATA VALID LOOP-BACK FOR HIGH SPEED SYNCHRONIZED DRAM CONTROLLER

BACKGROUND OF THE INVENTION

1. Field of the Invention

The present invention relates generally to synchronized memory technologies, and particularly to memory controllers for synchronous memories.

2. Background of the Invention

As synchronized memory technology progresses, there is an increasing need for developing synchronous memory controllers that can support the high clock speeds required as the state of the art for memory devices advances. Due to the improvements in processing technologies used to fabricate memory controllers, memory controller logic can be designed to run at such high clock rates. However, since typically a memory controller is externally coupled to a synchronous memory, signals exchanged between the memory controller and the synchronous memory may be delayed due to input/output ("I/O") pads and printed circuit board ("PCB") traces which facilitate the coupling between the memory controller and the synchronous memory.

The problem is more serious with higher clock frequencies or lower clock cycles. For example, the internal clock cycle of a high-speed memory has gone down to about 5 nanoseconds, but the delay of a signal due to impedance associated with an I/O pad and a PCB trace can be as long as about 10 nanoseconds, which is two times the value of the clock cycle. Delays like this may cause the memory controller to be out of sync with the synchronous memory. When synchronization is lost, wrong data will be latched by the memory controller in an attempt to read from the synchronous memory.

Since the delays are caused by impedance associated with the I/O pads and PCB traces, the I/O pads and PCB traces associated with a synchronized memory system must be designed and made carefully to meet the timing requirements. However, this goal is difficult to meet consistently because the I/O pads and PCB traces transmitting the signals have impedance characteristics that vary depending on the fabrication process, the voltage of the clock signal, and the operating temperature of the memory controller. These variations introduce clock uncertainty, thus reducing the actual memory clock frequency that the memory controller can use. Clock uncertainty, in turn, makes it difficult for such memory controllers to operate consistently and/or properly at high clock rates in the real world with synchronous memory.

Therefore, there is a need for a high-speed memory controller that can operate at its highest selected internal frequency or clock frequency when coupled to a synchronous memory, and still remain relatively immune from impedance variations caused by variations in fabrication process, voltage of clock signal, and operating temperature.

SUMMARY OF THE INVENTION

The present invention provides a method and system that eliminate or significantly reduce the effect of signal delays caused by I/O pads and PCB traces during the operation of a synchronized memory controller, thus allowing the memory controller to run at the highest internal clock frequency. The present invention advantageously provides a high-speed memory controller that can operate at high clock rates and remain relatively immune from impedance variations caused by fabrication processes, voltage of the clock signal, and/or operating temperature.

In one embodiment of the present invention, a memory controller is externally coupled to a synchronous memory. The memory controller generates a master clock signal to control the operation of the memory controller and the synchronous memory. A latch clock signal is generated by routing the master clock signal off-chip and then back to the memory controller through an I/O pad, at least one PCB trace, and another I/O pad. The memory controller also generates a read valid signal. The read valid signal is then routed off-chip and back to the memory controller as a read valid loop back signal. The read valid signal is routed off-chip via an I/O pad, at least one PCB trace, and another I/O pad. The memory controller latches read data from the synchronous memory based on the latch clock signal and the read valid loop back signal.

BRIEF DESCRIPTION OF THE DRAWINGS

FIG. 1 is a block diagram of a synchronous memory system in accordance with an embodiment of the present invention.

FIG. 2 is a timing diagram associated with the memory system as illustrated in FIG. 1.

DETAILED DESCRIPTION OF THE PREFERRED EMBODIMENTS

Figure 3:
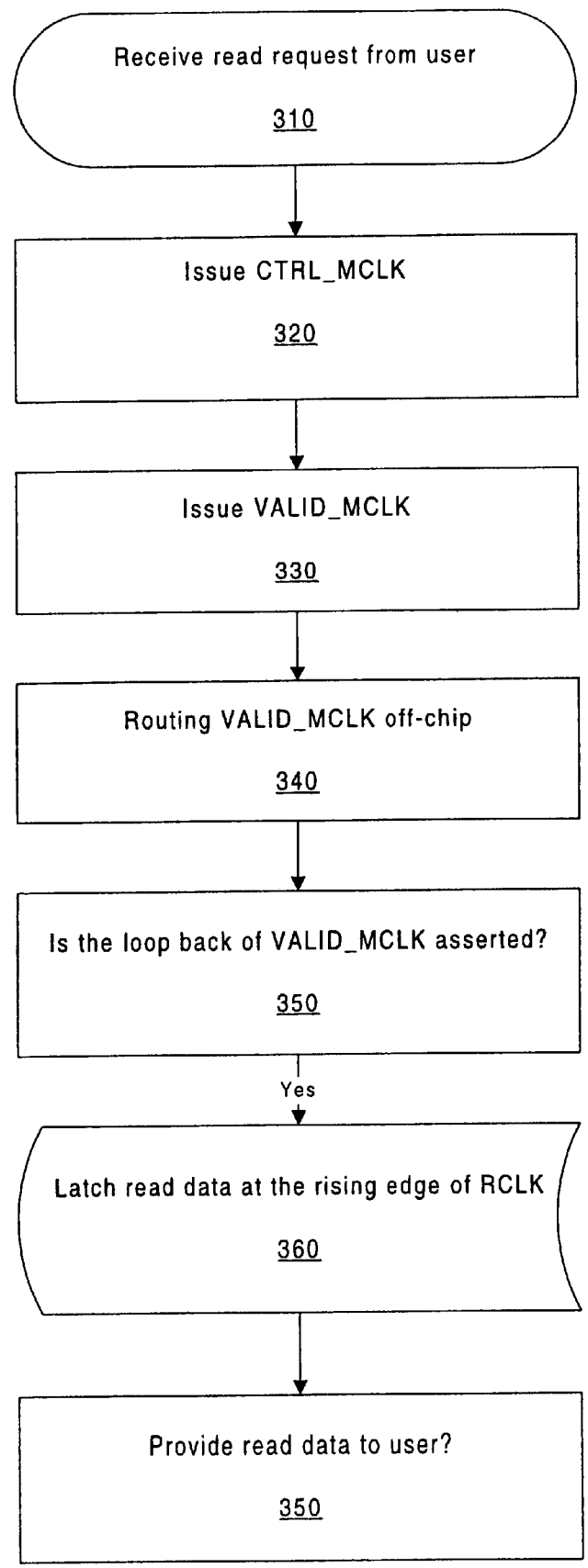
FIG. 3 is a flowchart diagram illustrating the operation of a memory controller in a synchronous memory system in accordance with an embodiment of the present invention.

In one embodiment of the present invention, a memory controller is externally coupled to a synchronous memory. The synchronous memory returns read data a certain number of clock cycles after receiving a read command from the memory controller. The memory controller includes an asynchronous First-In-First-Out ("FIFO") buffer, which latches the read data from the synchronous memory in response to two signals, a latch clock signal and a read valid loop back signal. The read valid loop back signal is asserted when read data for a given read command is anticipated. Both the latch clock signal and the read valid loop back signal originate from the memory controller and are routed off-chip in such a manner so that they encounter a similar delay characteristic as the read data from the memory. Therefore, any variations, due to fabrication process, voltage of clock signal and/or operating temperature, that may affect the I/O pads and PCB traces used by the read command and read data also affects the I/O pads and PCB traces used by the off-chip routing of the latch clock signal and read valid loop back signal. This permits the read valid loop back signal, the latch clock signal, and the read data to be synchronized regardless of variations in process, voltage, and/or temperature. Therefore, only valid read data signals are latched into the asynchronous FIFO buffer.

FIG. 1 is a block diagram of a system 100 in accordance with one embodiment of the present invention. As shown In FIG. 1, the system 100 comprises a memory controller 101 externally coupled to a synchionous memory 102, such as, for example, a synchronous dynamic random access memory ("SDRAM") or a synchronous graphics random access memory ("SGRAM"). The system 100 also includes PCB traces 103A, 103B, 103C, 103D, 103E, 103F. The memory controller 101 is externally coupled to the synchronous memory 102 by, for example, PCB traces 103A, 103B, and 103F. The memory controller 101 includes a phase lock loop (PLL) 110, a memory control logic 120 coupled to the PLL 110, a data buffer 121 associated with the memory control logic 120, an asynchronous first-in-first-out buffer ("Async_FIFO") 130 coupled to the PLL 110 and to the memory control logic 120, and six I/O pads 140A, 140B, 140C, 140D, 140E, and 140F. The I/O pad 140A is connected to the PCB trace 103A and coupled to the Async_FIFO 130. The I/O pad 140B is connected to the PCB trace 103B and coupled to the memory control logic 120. The I/O pad 140F is connected to the PCB trace 103F and coupled to the PLL 110. As shown in FIG. 1, the system 100 also comprises a PCB trace 103E which connects the PCB trace 103F to the I/O pad 140E. The system 100 also comprises two PCB traces 103C and 103D which are connected with each other and which together connect I/O pad 140C with I/O pad 140D.

FIG. 2 is a timing diagram associated with the system 100, in accordance with an embodiment of the present invention. FIG. 2 shows a master memory clock ("MCLK") signal 210 generated by the PLL 110, a valid memory clock signal ("VALID_MCLK") 220 generated by the memory control logic 120, and a read command ("CTR_MCLK") 230 also generated by the memory control logic 120. FIG. 2 also shows a memory clock ("MEM_CLOCK") signal 211 received by the synchronous memory 102, a read valid signal ("READ_VALID") 221 which is at least a delayed version of VALID_MCLK 220 after passing the I/O pad 140C and the PCB trace 103C, and a read command signal (MEM_CTRL) 231 as received by the synchronous memory 102. FIG. 2 also shows a memory data signal ("MEM_DATA") 240 returned by the synchronous memory 102 in response to receiving the MEM_CTRL 231. FIG. 2 further shows a return clock signal ("RCLK") 212 which is the loop back of MEM_CLOCK 211, a read valid loop back signal ("READ_VALID_I") 222 which is a loop back of READ_VALID 221, and a read data signal ("RDAT") 241 received by the Async_FIFO 130. The MCLK signal 210 includes cycles C1, C2, C3, C4, and C5, as shown in FIG. 2. The MEM_CLOCK signal 211 includes cycles C1, C2, C3, C4, and C5, as shown in FIG. 2. The RCLK signal 212 includes cycles C1, C2, C3, C4, and C5, as shown in FIG. 2.

Now referring to both FIG. 1 and FIG. 2, the function of the PLL 110 is to generate MCLK 210, and send this signal to the memory control logic 120, the Async_FIFO 130. All of the communications between the memory control logic 120 and the Async_FIFO 130 are with reference to MCLK 210. The PLL 110 also sends MCLK 210 to the synchronous memory 102 for the purpose of synchronizing the communications between the memory controller 101 and the synchronous memory 102. However, since the synchronous memory 102 is externally coupled to the PLL 110 through the PCB trace 103F and the I/O pad 140F, MCLK 210 becomes MEM_CLOCK 211 when it arrives at the synchronous memory 102. MEM_CLOCK 211 is at least a delayed version of MCLK 210 due to the impedance associated with the I/O pad 140F and the PCB trace 103F. This is illustrated in FIG. 2 where MEM_CLOCK 211 is shown to be delayed from MCLK 210 by a period of time T1. This delay period of time T1 is unpredictable because it depends on the geometric features of the I/O pad 140F and the PCB trace 103F, which are different from system to system due to variations in fabrication processes. T1 is also dependent on the voltage of the clock signal MCLK 211, which varies because of instabilities in any power source used by the memory system 100. T1 is also dependent on the operating temperature of the memory system, which varies depending on, for example, the environment in which the memory system 100 is being operated.

Part of the functions of the memory control logic 120 is to issue read commands per requests from a user (not shown) of the system 100. Still referring to FIG. 1 and FIG. 2, the memory control logic 120 issues a read command CTRL_MCLK 230 at cycle C1 of MCLK 210. The read command CTRL_MCLK 230 needs to go through the I/O pad 140B and the PCB trace 103B in order to reach the synchronous memory 102, and there, it becomes signal MEM_CTRL 231. MEM_CTRL 231 is delayed from CTRL_MCLK 230 due to impedance associated with the I/O pad 140B and the PCB trace 103B. Since the impedance associated with the I/O pad 140B and the PCB trace 103B, and that associated with the I/O pad 140F and the PCB trace 103F, are subject to the same variations in fabrication processes, voltage of clock signal and operating temperature, the I/O pads 140B and the PCB traces 103B can be designed in reference to the design of the I/O pad 140F and the PCB trace 103F so that MEM_CTRL 231 is delayed from CTRL_MCLK by the same time period T1 as MEM_CLOCK 211 is delayed from MCLK 210. Therefore the MEM_CTRL 231 is received by the synchronous memory 102 at cycle C1 of MEM_CLOCK 211.

Still referring to FIG. 1 and FIG. 2, in one embodiment of the present invention, in response to receiving the MEM_CTRL 231 at cycle C1 of MEM_CLOCK 211, the synchronous memory 102 returns read data ("MEM_DATA") 240 at cycle C3 of MEM_CLOCK 211. Since the read data has to go through the PCB trace 103A and the I/O pad 140A in order to reach the Async_FIFO 130, the read data RDAT 241 received by the Async_FIFO 130 is delayed from MEM_DATA 240 by a period of time T2, due to the impedance associated with the PCB trace 103A and the I/O pad 140A.

A loop back of the MEM_CLOCK 211, the RCLK 212 is used as a latch clock signal by the Async_FIFO 130 to latch read data. The RCLK 212 is created by looping back the MEM_CLOCK 211 through the PCB trace 103E and the I/O pad 140E. This is intended so that, due to the impedance associated with the PCB trace 103E and the I/O pad 140E, the RCLK signal 212 is delayed from MEM_CLOCK 211 just as RDAT 241 is delayed from MEM_DAT 240. Since the impedance associated with the I/O pad 140E and the PCB trace 103E, and that associated with the I/O pad 140A and the PCB trace 103A, are subject to the same variations in fabrication processes, voltage of clock signal and operating temperature, the I/O pad 140E and the PCB trace 103E can be designed in reference to the design of the I/O pad 140A and the PCB traces 103A so that RDAT 241 and RCLK 212 are synchronized.

In anticipation of receiving the read data, the memory control logic 120 also issues a read valid signal VALID_MCLK 220 for each read command. The read valid signal is intended for the Async_FIFO 130 to use as a write enable when latching the read data from the synchronous memory 102. In order to synchronize the read valid signal with the read data RDAT 241 and the latch clock signal RCLK 212, the read valid signal is routed off-chip and looped back to the memory controller 101, through the I/O pad 140C, the PCB trace 103C, the PCB trace 103D and the I/O pad 140D. The read valid loop back signal READ_VALID_I 222 is then used as a write enable signal for the Async_FIFO 130 to latch read data from the synchronous memory 102. Since any variations due to fabrication processes, the voltage of the clock signal or the operation temperature that may affect the I/O pads and PCB traces used by RCLK 212 also affects the I/O pads and PCB traces used by READ_VALID_I 222, the I/O pad 140C, the PCB trace 103C, the PCB trace 103D and the I/O pad 140D can be designed so as to create a delay characteristic for the READ_VALID_I 222 that is similar to that of RCLK 212, i.e., the READ_VALID_I 222 is delayed from VALID_MCLK 220 by a same time period as RCLK 212 is delayed from MCLK 210, regardless of the aforementioned variations. In one embodiment of the present invention, the I/O pad 140C, the PCB traces 103C and 103D, and the I/O pad 140B are designed in reference to the design of the I/O pad 140F, the PCB traces 103F and 103E, and the I/O pad 140E, so that the READ_VALID signal 221, is delayed by a period of time T1 from the VALID_MCLK 220, and the loop back of READ_VALID 221, the READ_VALID_I signal 222, is delayed from READ_VALID 221 by a period of time T2 due to the impedance associated with the PCB trace 103D and the I/O pad 140D, as shown in FIG. 2. Similarly, as recited above, MEM_CLOCK 211 is delayed from MCLK 210 by a period of T1 due to impedance associated with the I/O pad 140F and the PCB trace 103F, and RCLK 212 is delayed from MEM_CLOCK 211 by a period of T2 due to impedance associated with the PCB trace 103E and the I/O pad 140E.

In one embodiment of the present invention, the Async_FIFO 130 is a conventional asynchronous first-in-first-out buffer comprising two ports for communicating with two different agents with two different clocks. The memory control logic 120 as one agent communicates with one port of the Async_FIFO 130 using the MCLK signal 210. The synchronous memory 102 as another agent communicates with another port of the Async_FIFO 130 using the RCLK signal. This port of the Async_FIFO 130 that communicates with the synchronous memory 102 is designed to latch read data RDAT 241 at the rising edge of RCLK 212 when the read valid loop back signal READ_VALID_I 222 is asserted. Since the I/O pads and the PCB traces used to route these signals are now subject to the same variations in fabrication processes, the voltage of the clock signal, and the operating temperature, the latch clock signal RCLK 212, the write enable READ_VALID_I 222, and the read data RDAT 241 are synchronized regardless of aforementioned variations. Therefore this embodiment of the present invention permits the right read data to be captured by the Async_FIFO 130 regardless of the variations due to fabrication processes, voltage of clock signal and operating temperature.

Once the read data RDAT is captured by the Async_FIFO 130, it is stored in the Async_FIFO 130 and then sent to the data buffer 121 associated with the memory control logic 120 on a first-in-first-out basis and under the control of MCLK 210. In an alternative embodiment, the data buffer 121 is not used, and the read data is provided to the user of the system 100 from the Async_FIFO 130 by the memory control logic 120.

FIG. 3 is a flowchart diagram illustrating a read operation of the memory controller 101 in response to receiving a user request 310 to read data from the synchronous memory 102 in the memory system 100 in accordance with one embodiment of the present invention. The memory controller 101 issues 320 a read command CTRL_MCLK 230 corresponding to the user request and the read command is sent to the synchronous memory 102. In anticipation of receiving read data returned by the synchronous memory 102, the memory controller 101 issues 330 a write enable signal VALID_MCLK 220. The write enable signal VALID_MCLK 220 is routed 340 off-chip and back to the memory controller 101. The memory controller 101 then checks 350 if the loop back of the write enable signal, READ_VALID_I 222, is asserted. If it is asserted, the memory controller 101 latches 360 the read data from the synchronous memory 102 at the rising edge of the latch clock signal RCLK 212. The read data is then provided 350 to the requesting user.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. In a synchronized memory system, a method for fetching read data from a synchronous memory, the method comprising:

generating a master clock signal;

routing the master clock signal off-chip to create a latch clock signal, the latch clock signal being at least a delayed version of the master clock signal due to the off-chip routing;

generating a read valid signal;

routing the read valid signal off-chip to generate a read valid loop back signal, the read valid loop back signal being delayed from the read valid signal similarly as the latch clock signal is delayed from the master clock signal; and latching the read data in response to the latch clock signal and the read valid loop back signal.

2. The method of claim 1 wherein the read valid signal is transmitted through at least one I/O pad and at least one PCB trace.

3. The method of claim 1, wherein the memory controller comprises an asynchronous FIFO buffer for latching the read data in response to the latch clock signal and the read valid loop back signal.

4. In a synchronized memory system, a memory controller comprising:

a phase locked loop (PLL) configured to generate a master clock signal;

at least one input/output (I/O) pad and at least one trace configured to route off-chip the master clock signal to generate a latch clock signal;

a memory control logic configured to receive the master clock signal from the PLL, and to generate a read command and a read valid signal for each generated read command;

at least one I/O pad and at least one trace configured to route the read valid signal off-chip to generate a read valid loop back signal; and an asynchronous first-in-first-out (FIFO) buffer configured to receive the latch clock signal and the read valid loop back signal, and to latch read data corresponding to the read command in response to the latch clock signal and the read valid loop back signal.

5. The memory controller of claim 4 wherein the asynchronous FIFO buffer latches the read data at a rising edge of the latch clock signal and when the read valid loop back signal is active.

6. A synchronized memory system, comprising:

a memory controller configured to generate a latch clock signal and a read valid loop back signal; and a synchronous memory coupled to the memory controller and configured to generate read data in response to a read request from the memory controller;

wherein the latch clock signal and the read valid loop back signal are routed external to the memory controller and are delayed by a substantially similar time amount.

7. The synchronized memory system of claim 6 wherein the latch clock signal is routed along a first path external to the memory controller.

8. The synchronized memory system of claim 6 wherein the read valid loop back signal is routed along a second path external to the memory controller.

9. A method of reading data from a synchronous memory, the method comprising:

generating latch clock signal from a memory controller;

generating a read valid loop back signal from the memory controller;

routing the latch clock signal and the read valid loop back signal along paths external to the memory controller so that the latch clock signal and the read valid loop back signal are delayed by a substantially similar time amount.

10. A synchronized memory system, comprising:

a memory controller configured to generate a latch clock signal and a read valid loop back signal; and a synchronous memory coupled to the memory controller and configured to generate read data in response to a read request from the memory controller;

wherein the latch clock signal is synchronized with the read valid loop back signal.

11. The synchronized memory system of claim 10 wherein the latch clock signal is routed along a first path external to the memory controller.

12. The synchronized memory system of claim 10 wherein the read valid loop back signal is routed along a second path external to the memory controller.

13. A method of reading data from a synchronous memory, the method comprising:

generating latch clock signal from a memory controller;

generating a read valid loop back signal from the memory controller;

routing the latch clock signal and the read valid loop back signal along paths external to the memory controller so that the latch clock signal is synchronized with the read valid loop back signal.

* * * * *